United States Patent [19]

Sonobe

[11] Patent Number: 5,016,041

[45] Date of Patent: May 14, 1991

[54] IMAGE RECORDING APPARATUS HAVING SHEET NIP RELEASING MECHANISM AND SHUTTER MECHANISM

[75] Inventor: Katsuyoshi Sonobe, Nagoya, Japan

[73] Assignee: Brother Kogyo Kabushiki Kaisha, Japan

[21] Appl. No.: 581,057

[22] Filed: Sep. 12, 1990

[30] Foreign Application Priority Data

Oct. 31, 1989 [JP] Japan .................................. 1-285308
Oct. 31, 1989 [JP] Japan .................................. 1-285313

[51] Int. Cl.⁵ ........................ G03B 27/32; G03B 27/52
[52] U.S. Cl. ........................................ 355/27; 226/49; 430/138
[58] Field of Search ..................... 242/71.6; 226/49; 355/27, 51, 100; 354/302, 301; 430/138; 346/76 PH

[56] References Cited

U.S. PATENT DOCUMENTS

| | | | |
|---|---|---|---|
| 4,868,919 | 9/1989 | Tanaka et al. | 355/27 |
| 4,894,666 | 1/1990 | Ishikawa et al. | 346/76 PH |
| 4,935,768 | 6/1990 | Ibuchi | 355/27 |
| 4,945,382 | 7/1990 | Yui et al. | 355/27 |
| 4,970,548 | 11/1990 | Shibata et al. | 355/27 X |
| 4,977,437 | 12/1990 | Asai et al. | 355/27 |

Primary Examiner—Richard A. Wintercorn
Attorney, Agent, or Firm—Oliff & Berridge

[57] ABSTRACT

An image recording apparatus having reversal feed means for feeding an elongated photosensitive sheet in a reverse direction. The photosensitive sheet undergoes exposure operation and a pressure developing operation. Since unexposed zone is positioned subsequent to the exposure zone, the unexposed zone is also positioned at downstream side of the exposure portion by the pressure developing operation to the preceeding exposure zone. The reversal feed means is adapted for moving an unexposed zone of the photosensitive sheet positioned at downstream side of the exposure portion to an upstream side thereof. A sheet nip releasing mechanism is provided in the apparatus for releasing sheet nipping force given by feed rollers during the reversal sheet feeding. Further, a shutter mechanism is provided for avoiding light irradiation to the unexposed zone during the reverse travel.

8 Claims, 4 Drawing Sheets

IMAGE RECORDING APPARATUS HAVING SHEET NIP RELEASING MECHANISM AND SHUTTER MECHANISM

BACKGROUND OF THE INVENTION

The present invention relates to an image recording apparatus, and more particularly, to the apparatus in which an unexposed zone of a photosensitive sheet positioned at downstream side of an exposure zone is fed back to an upstream side thereof for using the unexposed zone for a next exposure operation.

In a conventional image recording apparatus, a rolled photosensitive sheet wound over a sheet roll core is taken up by a takeup shaft through an exposure portion, a pressure developing unit, and a separation portion. In the exposure portion, the photosensitive sheet is subjected to light exposure for forming a latent image thereon, and in the pressure developing unit, the photosensitive sheet carrying the latent image thereon is superposed with a cut developer sheet and these sheets are pressed together for forming a visible image on the developer sheet. Further, at the separation portion, the photosensitive sheet is separated from the developer sheet, and the light exposed photosensitive sheet is taken up by the takeup shaft.

In the conventional apparatus a pair of feed rollers are provided at a position between the exposure portion and the pressure developing unit for nippingly feed the photosensitive sheet toward the pressure developing unit at a constant speed. The photosensitive sheet may be a microcapsule sheet in which an immense number of microcapsules encapsulating therein chromogenic material and photosensitive resin, etc. are coated over a substrate to provide a photosensitive layer.

In this type of the conventional apparatus, an area of the photosensitive sheet at a position between a trailing edge portion of the light-exposed photosensitive sheet and a leading edge portion of a newly light exposed portion does not serve for the formation of the latent image. That is, this area is merely wound over the takeup shaft. Therefore, entire area of the photosensitive sheet cannot be effectively used.

To avoid this drawback, after separation of the developer sheet from the photosensitive sheet, the unexposed zone of the photosensitive sheet positioned at downstream side of the exposure portion is fed back to the upstream side thereof by reversely rotating the rolled photosensitive sheet, so that the unexposed zone subsequent to the exposed zone can be used for the exposure, to thereby minimize sheet wasted area.

However, since the pair of feed rollers are continuously nipping the photosensitive sheet, the unexposed area may be damaged by the nipping pressure, that is, the microcapsules may be ruptured, or the photosensitive layer may be damaged. If such damaged zone is used for the next exposure operation, resultant output image may be degraded, and clear output image may not be obtainable.

Further, during the reversal feeding of the photosensitive sheet, if the unexposed area is subjected to accidental light irradiation, this area may become unavailable for the next exposure operation.

SUMMARY OF THE INVENTION

Therefore, it is an object of the present invention to overcome the above described drawbacks, and to provide an improved image recording apparatus in which clear output image can be provided without any damaged portion even if unexposed area of a photosensitive sheet is fed back to an upstream position of an exposure portion, and this area is employed for the formation of a latent image.

Another object of this invention is to provide such apparatus in which the photosensitive sheet can be used along entire length thereof by reducing an area of unavailable portion for the light exposure.

Still another object of the invention is to provide the improved image recording apparatus in which an unexposed area of the photosensitive sheet is not subjected to accidental light irradiation during reverse feeding phase of the sheet.

These and other objects of the invention will be attained in the present invention by providing an image recording apparatus for forming a latent image on a rolled photosensitive sheet, the latent image corresponding to an image of an original, and for forming a visible image on a developer sheet, the visible image corresponding to the latent image, the apparatus comprising; a cartridge shaft on which the rolled photosensitive sheet is provided, an exposure portion on which the photosensitive sheet is positioned to form the latent image thereon, to thus provide an exposed zone, an unexposed zone being subsequent to the exposed zone, a pressure developing unit positioned downstream of the exposure portion for superposing the exposed zone with the developer sheet and for pressing these sheet together for forming the visible image on the developer sheet, a separation means positioned downstream of the pressure developing unit for separating the photosensitive sheet from the developer sheet, a takeup means positioned downstream of the separation means for taking up the light exposed photosensitive sheet thereover, the photosensitive sheet being fed in one direction from the cartridge shaft to the takeup means, feeding means positioned between the exposure portion and the pressure developing unit for nippingly feeding the photosensitive sheet toward the pressure developing unit at a constant speed in the one direction, a sheet nip releasing mechanism connected to the feeding means for releasing the sheet nipping force of the feeding means when the unexposed zone of the photosensitive sheet is moved from the downstream portion of the exposure portion to the upstream portion thereof after the photosensitive sheet is separated from the developer sheet, and a reversal feed driving means for moving the photosensitive sheet in a second direction opposite the one direction.

In another aspect of the invention, there is provided an image recording apparatus for forming a latent image on a rolled photosensitive sheet, the latent image corresponding to an image of an original, and for forming a visible image on a developer sheet, the visible image corresponding to the latent image, the apparatus comprising, a cartridge shaft on which the rolled photosensitive sheet is provided, an exposure portion on which the photosensitive sheet is positioned to form the latent image thereon, to thus provide an exposed zone, an unexposed zone being subsequent to the exposed zone, an optical path being directed to the exposure portion, a pressure developing unit positioned downstream of the exposure portion for superposing the exposed zone with the developer sheet and for pressing these sheet together for forming the visible image on the developer sheet, a separation means positioned downstream of the pressure developing unit for separating the photosensitive sheet from the developer sheet, a takeup means positioned downstream of the separation means for taking up the light exposed photosensitive sheet thereover, the photosensitive sheet being fed in one direction from the cartridge shaft to the takeup means, a reversal feed driving means for moving the photosensitive sheet in a second direction opposite the one direction in order to move the unexposed zone positioned downstream of the exposure portion to the upstream side thereof, and a shutter mechanism having a shutter movable between a retract position for allowing a light to direct to the exposure portion and a closing position for blocking the light on the optical path, and means for driving the shutter to the retract position during the exposure operation and to the closing position during the reversal feed of the photosensitive sheet, whereby the light irradiation to the unexposed zone is avoidable during the reversal feed.

When the exposure operation is completed, the sheet nip releasing mechanism releases sheet nipping force of the feeding means with respect to the photosensitive sheet. When the developer sheet is separated from the photosensitive sheet at the separation means, the unexposed zone of the photosensitive sheet positioned downstream of the exposure portion is reversely fed to the sheet cartridge, so that the unexposed portion can be positioned upstream of the exposure portion. Therefore, when the unexposed zone passes through the feeding means during the reversal feeding, the unexposed zone may not be damaged by the feeding means. Accordingly, the unexposed zone is available for the next exposure operation.

Further, during the reversal feeding of the photosensitive sheet, the shutter mechanism blocks the optical path directing to the exposure portion. Therefore, even if external light is entered into the optical path, the light can be blocked by the shutter mechanism, and accordingly, the unexposed zone can avoid light irradiation during the reversal feed.

DETAILED DESCRIPTION OF THE PREFERRED EMBODIMENT

Figure 1:
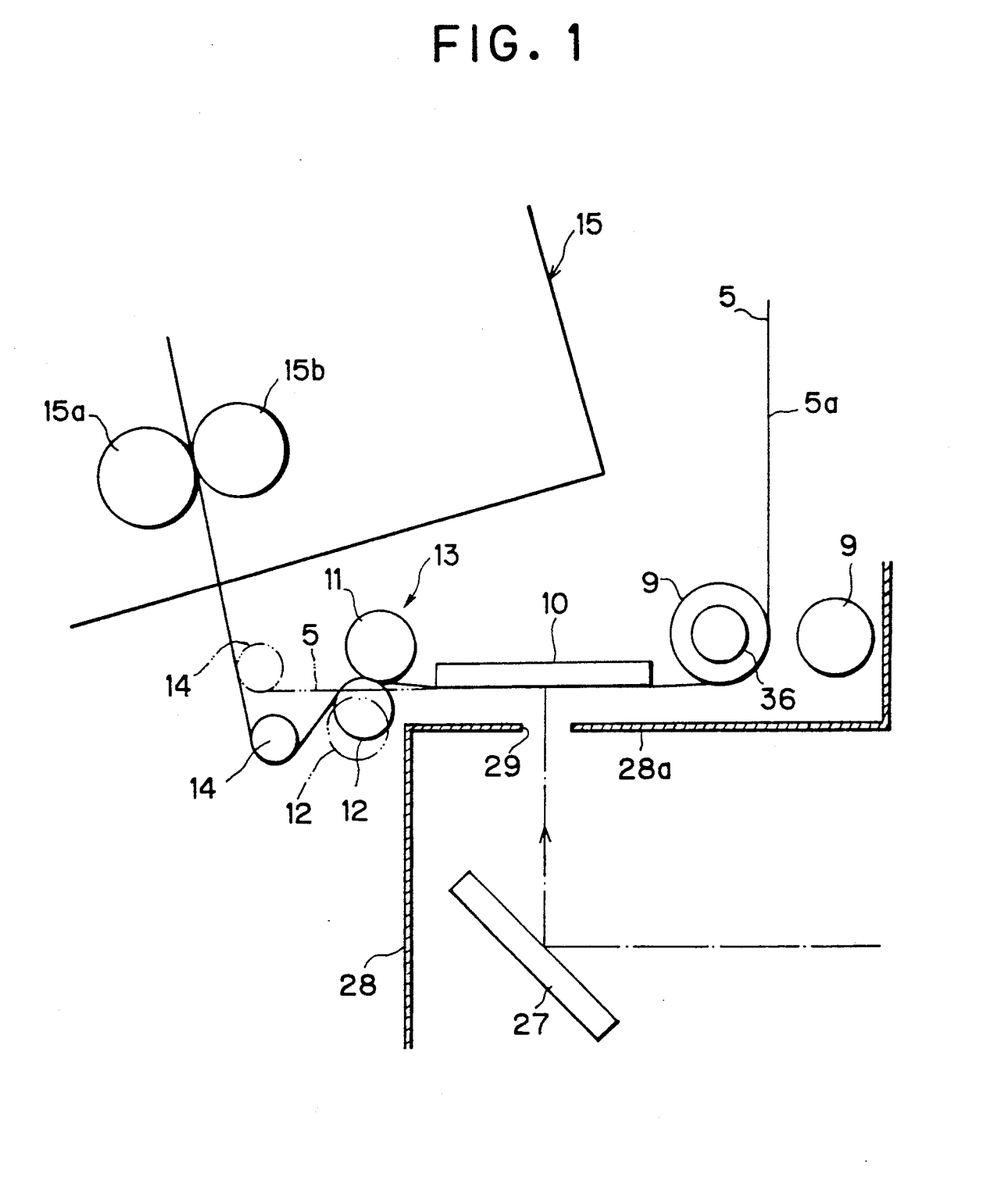
FIG. 1 is a schematic view showing an essential portion of an image recording apparatus having a sheet nip releasing mechanism according to one embodiment of the present invention.
Figure 2:
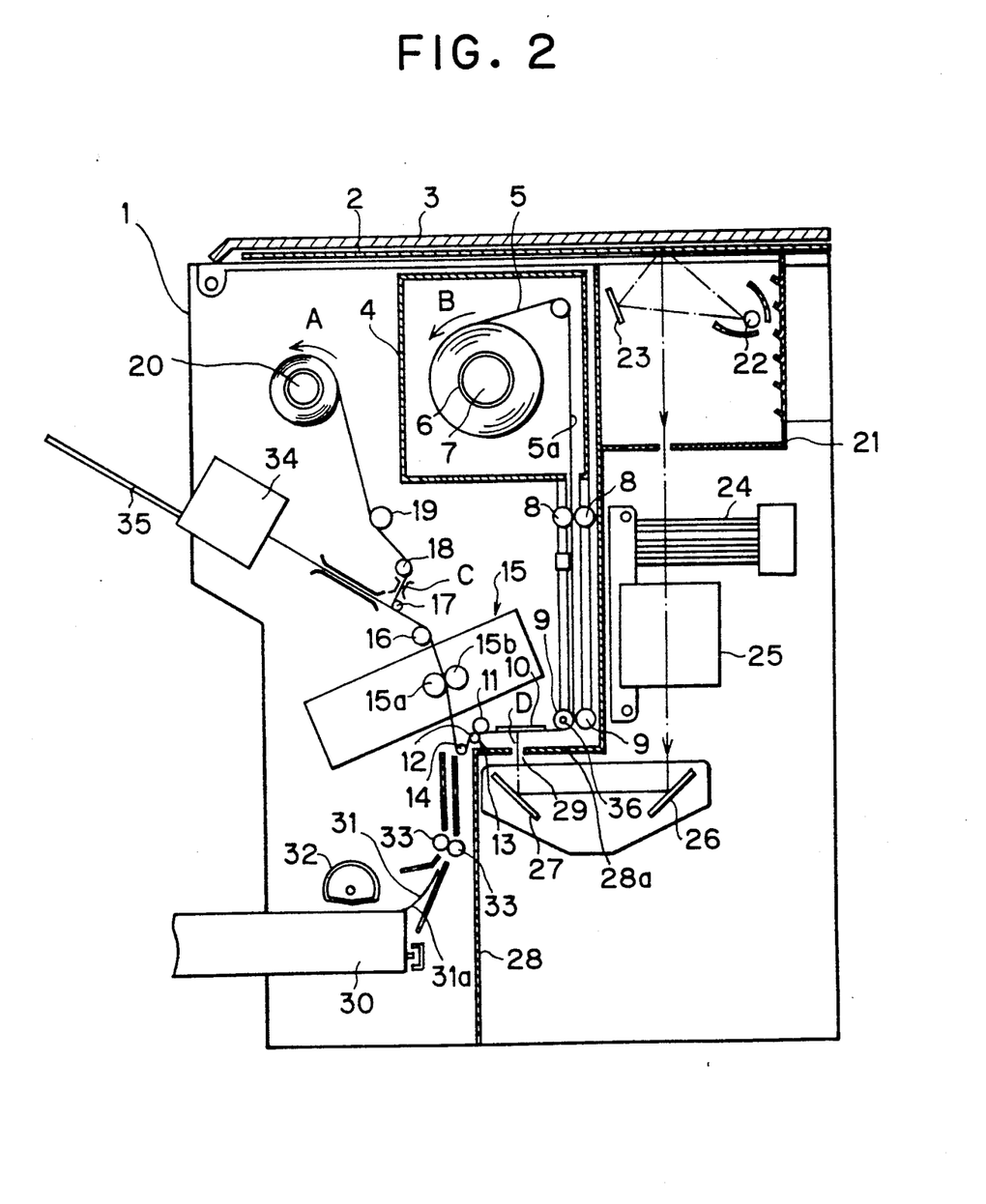
FIG. 2 is a schematic cross-sectional side view showing the image recording apparatus according to the one embodiment.

An image recording apparatus according to one embodiment of the present invention is generally shown in FIGS. 1 and 2. The recording apparatus pertains to a full color copying machine. At the upper portion of an apparatus frame 1, an original support glass 2 for mounting an original (not shown) thereon and a cover 3 for selectively covering the support glass 2 are laterally movably provided. At a position below the original support glass 2, there is provided a sheet cartridge 4 and a light irradiation chamber 21 positioned beside the sheet cartridge 4.

At an upper inner space of the apparatus frame 1, a sheet cartridge 4 is provided, and a tape-up shaft 20 is rotatably provided. In the sheet cartridge 4, stored is a rolled photosensitive sheet 5 rolled over a sheet roll core 6 disposed over a cartridge shaft 7. The cartridge shaft 7 also functions as a reverse feed take up means described later. The photosensitive sheet 5 has a photosensitive surface 5a in which coated are an immense number of microcapsules which encapsulate therein chromogenic material, photocurable resin and photopolymerization initiator. The photosensitive sheet 5 is rolled over the sheet roll core 6 in such a manner that the photosensitive layer 5a is positioned radially outwardly.

Two pairs of feed rollers 8, 8 and 9, 9 are rotatably provided so as to feed the elongated photosensitive sheet 5 from the sheet cartridge 4. Further at a position downstream of the feed rollers 9, 9, an exposure stand 10 is provided. At a downstream portion of the exposure stand 10, a pair of feed rollers including a drive roller 11 and a pinch roller 12, and a dancer roller 14 are provided. At a downstream portion of the dancer roller 14, a pressure developing unit 15 including pressure rollers 15a and 15b are provided. Further, a guide roller 16, a separation roller 17, a guide rollers 18, 19 and the takeup shaft 20 are provided in order with respect to a feeding direction of the photosensitive sheet 5. The takeup shaft 20 is rotatable in a direction indicated by an arrow A by a drive motor (not shown) for winding a light exposed photosensitive sheet 5 thereover, and is rotatable in an opposite direction, i.e., the direction B for reverse feeding of the photosensitive sheet 5.

These components are positioned in a first space defined by a partitioning wall 28 having a vertical portion and a horizontal portion 28a formed with an opening 29. The exposure zone 10 is positioned at a position immediately above the horizontal portion 28a. The partitioning wall 28 also defines a second space in which optical components are provided.

The optical components includes a light irradiation chamber 21 positioned immediately below the original support glass 2 and beside the sheet cartridge 4. In the light irradiation chamber 21, provided are halogen lamp 22 for irradiating light to the original on the original support glass 2 and a reflection mirror 23 for reflecting light from the halogen lamp to the original support glass 2. The halogen lamp 22 extends in a direction perpendicular to the moving direction of the original support glass 2. During light emission of the light source 22, the original support glass 2 is laterally moved so that the overall area original is subjected to light irradiation. Further, a filter unit 24 and a lens unit 25 are provided. Furthermore, below the lens unit 25, a pair of reflection mirrors 26, 27 are provided. Therefore, light from the light source 22 is reflected at the original, and the reflected light passes through the filter unit 24, the lens unit 25 and the reflection mirrors 26, 27, to thereby reach the exposure stand 10 through the opening 29 of the horizontal partitioning portion 28a. Thus, generally J shaped optical path is provided by the optical system so as to irradiate image carrying light to the photosensitive sheet 5 positioned on the exposure stand 10, to thereby form a latent image on the photosensitive sheet 5.

At a position within the frame 1 and below the pressure developing unit 15, a developer sheet cassette 30 is provided which stores a stack of cut developer sheets 31. The developer sheet is of rectangular shape and has a developer material layer 31a on a substrate. The developer material layer 31a is reactable with the chromogenic material of the microcapsules to provide a visible image on the surface 31a. A sector roller 32 is provided immediately above the sheet cassette 30 for delivering each one of the developer sheet 31 from the sheet cassette 30. Further, a pair of feed rollers 33, 33 are provided for feeding the developer sheet 31 toward the pressure developing unit 15. The light exposed portion of the photosensitive sheet 5 and the developer sheet 31 are in close contact with each other and these are pressed together at the pressure developing unit 15. Consequently, a colored visible image corresponding to the latent image is formed on the developer sheet 31. Incidentally, the pressure rollers 15a and 15b provide a sheet pressurizing state during the pressure developing operation. However, in operational phases other than the pressure developing operation, these rollers 15a and 15b are relatively moved away from each other to release the sheet nipping force.

At downstream side of the separation roller 17, a thermal fixing unit 34 is provided for thermally fixing an output image on the developer sheet 31. At downstream side of the thermal fixing unit 34, a sheet tray 35 is provided for receiving the developer sheet carrying the final output image.

Further, an encoder 36 is provided in one of the feed rollers 9 positioned closer to the exposure stand 10 than the other feed roller 9 as best shown in FIG. 2. The encoder 36 is adapted for detecting reversal feed length of the photosensitive sheet 5 in accordance with rotation numbers of the feed roller 9. For this, the encoder 9 counts numbers of pulse generated in response to the rotation of the feed roller 9. If the pulse counts reaches a predetermined pulse numbers, the reversal sheet feed length is detectable.

Next, a sheet nip releasing mechanism will be described with reference to FIG. 3. As described above, the feed rollers 13 positioned immediately downstream side of the exposure stand 10 includes the drive roller 11 and the pinch roller 12 for positively feeding the photosensitive sheet 5 toward the pressure developing unit 15. However, at the time of the reversal sheet feeding, the sheet nipping force is released by the sheet nip releasing mechanism. More specifically, upon completion of the exposure operation, a subsequent green zone or unexposed zone of the photosensitive sheet 5 is also fed to a position downstream of the exposure table 10. In order to maximumly use the photosensitive sheet 5, the green zone should be reversely fed to the upstream side of the exposure table 10, so that the next exposure operation is started with the green zone. During this reverse feeding, the nipping force given by the rollers 11 and 12 are released so as to avoid any rupture of the microcapsules at the green zone.

In the illustrated embodiment, the drive roller 11 is rotatable about a stationary axis, whereas the pinch roller 12 is movable toward and away from the drive roller 11. More specifically, as shown in FIG. 3, the pinch roller 12 has a pinch roller shaft 12a. Further, a pair of first links 38, a second links 40 and a lever 45 are provided (in FIG. 3, only one first link 38 is shown for simplicity). The first links 38 have one ends to which both axial ends of the pinch roller shaft 12a are rotatably supported. Further, a torsion spring 39 is connected to the pinch roller shaft 12a so as to normally urge the shaft 12a toward the drive roller 11. Accordingly, the pinch roller 12 is urged toward the drive roller 11 through the photosensitive sheet 5. The first links 38 have another ends rotatably connected to one end of the second link 40. The second link 40 has an intermediate portion rotatably connected to the frame 1 by a shaft 41. The second link 40 has another end connected to a coil spring 42 for urging the another end downwardly (the second link 40 is urged to be rotated about the shaft 41 in a counterclockwise direction in FIG. 3). The another end portion of the second link is also connected to one end of a wire 43 whose another end portion is connected to one end portion of a lever 45 through a pulley 44.

The lever 45 has another end in contact with a cam member 47, and has an intermediate portion pivotally supported to the frame 1 by a shaft 46. The cam member 47 is provided integral with a gear wheel 48. A drive motor (not shown) is provided for driving the gear wheel 48 immediately after the exposure operation to the photosensitive sheet 5. Further, a sensor 49 such as a photosensor is provided for detecting an original rotary position of the cam 47.

Figure 3:
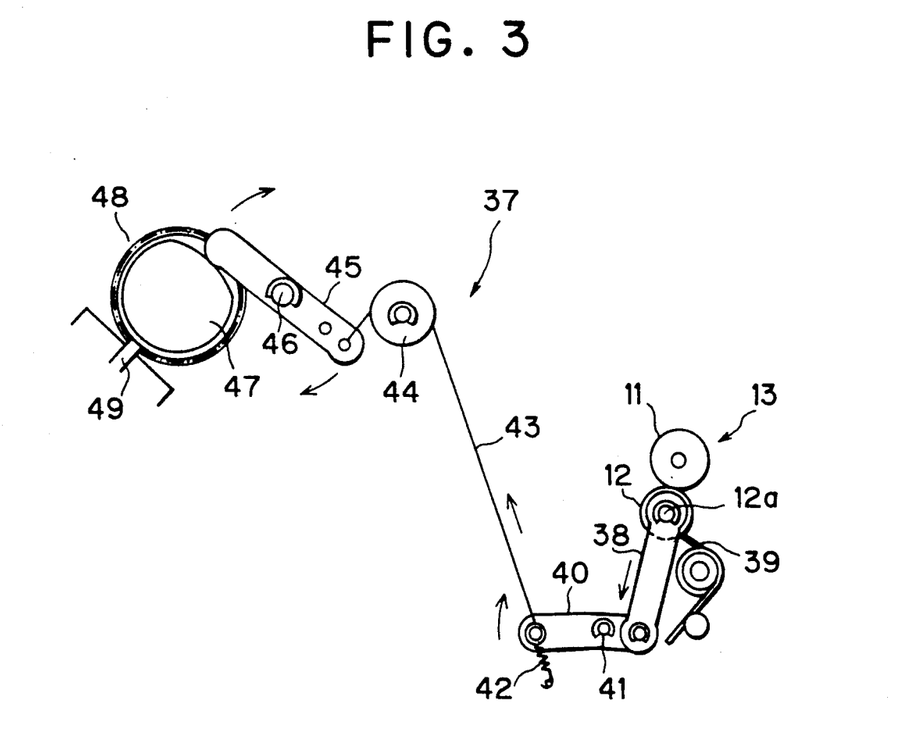
FIG. 3 is a schematic side view showing the sheet nip releasing mechanism according to the one embodiment.

If the drive motor (not shown) is energized immediately after the exposure operation, the gear wheel 48 and the cam member 47 are rotated about their axes (in a clockwise direction in FIG. 3). In response to the rotation, the lever 45 is pivotally moved about the shaft 46 in a direction indicated by an arrow in FIG. 3, and the second link 40 is also pivotally moved about the shaft 41 in the direction indicated by an arrow through the wire 43. Therefore, the first links 38 are moved downwardly against the biasing force of the torsion spring 39. Accordingly, the pinch roller 12 is moved away from the drive roller 11 as shown by two dotted chain line in FIG. 1, so that nipping force to the photosensitive sheet 5 is released at the feed roller 13.

Figure 4:
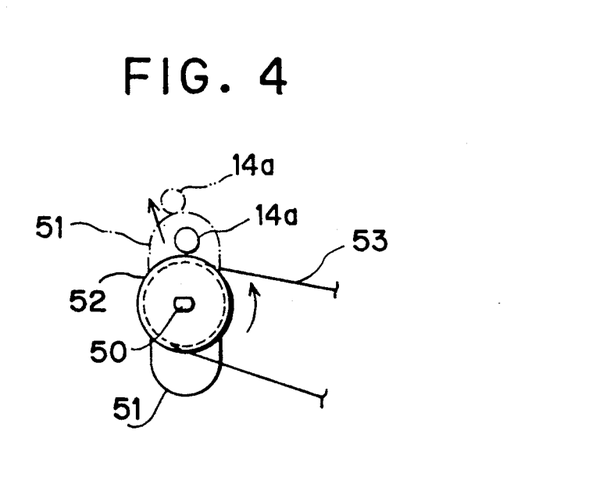
FIG. 4 is a side schematic side view showing a mechanism for moving a dancer roller according to the one embodiment.

Further, as shown in FIG. 1, the dancer roller 14 performs sheet slack absorbing function when it is positioned shown in a solid line during the exposure operation. On the other hand, the dancer roller 14 is moved to a position shown by two dotted chain line after the exposure operation. More specifically, as shown in FIG. 4, the dancer roller 14 has a dancer roller shaft 14a. Further, a cam shaft 50 extends in parallel with the dancer roller shaft 14a, and a pair of cam pieces 51 contactable with the dancer roller shaft 14a extend radially outwardly from axial both end portions of the cam shaft 50. Furthermore, a pulley 52 is mounted on the one end portion of the cam shaft 50, and a power transmission belt 53 is mounted on the pulley 52. When exposure operation is completed, the cam pieces 51 are moved from solid line position to two dotted chain line position in FIG. 4, so that the dancer roller shaft 14a is urged to be moved upwardly. Accordingly the dancer roller 14 is moved to two dotted chain line position in FIG. 1.

Next, a shutter mechanism will be described with reference to FIGS. 5 and 6. In the illustrated embodiment, shutter mechanism is adapted to prevent light from leaking through the opening 29 to the photosensitive sheet 5 during the reverse travel of the photosensitive sheet 5. More specifically, the photosensitive sheet 5 is reversely fed so as to utilize the unexposed zone thereof positioned downstream side of the exposure stand 10 for the next image recording operation. During this reverse travel, if the original cover member 3 is opened for installing a new original on the original support glass 2, the light may be entered through the glass 2 and may reach the opening 29. As a result, the reversely fed unexposed zone of the photosensitive sheet 5 may be exposed to the leaked light, and therefore, the sheet may become unavailable for the next image recording operation. In view of the fact, in the present invention, the shutter mechanism is provided.

Figure 5:
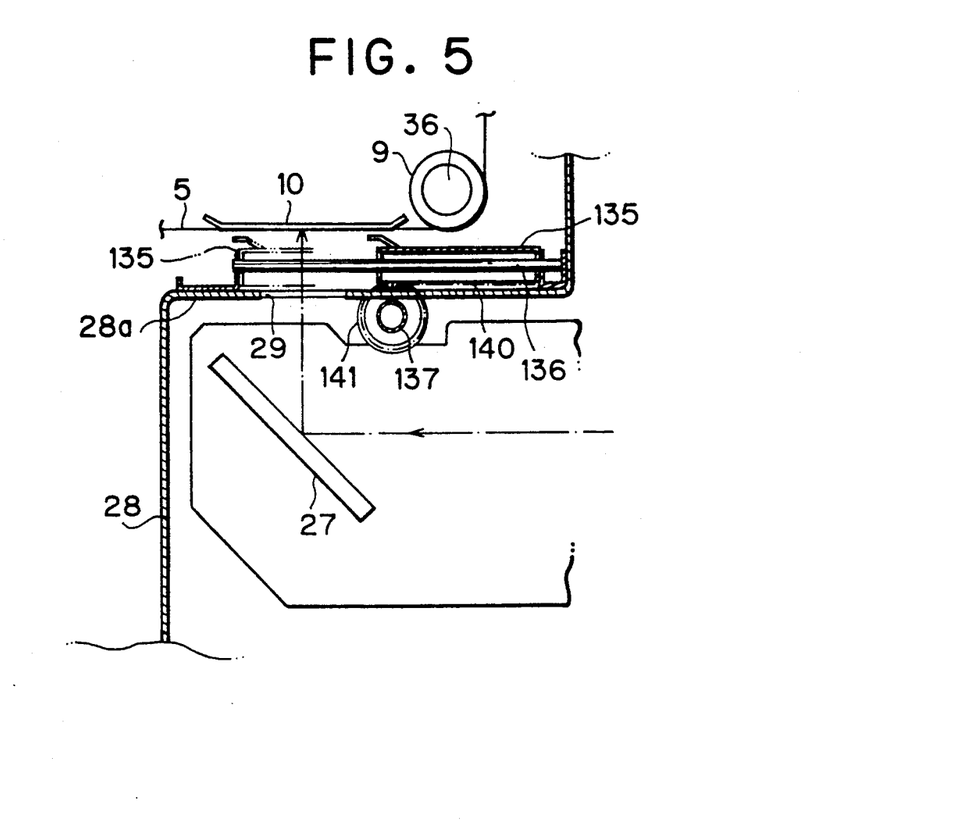
FIG. 5 is a cross-sectional side view showing a shutter mechanism according to the one embodiment.
Figure 6:
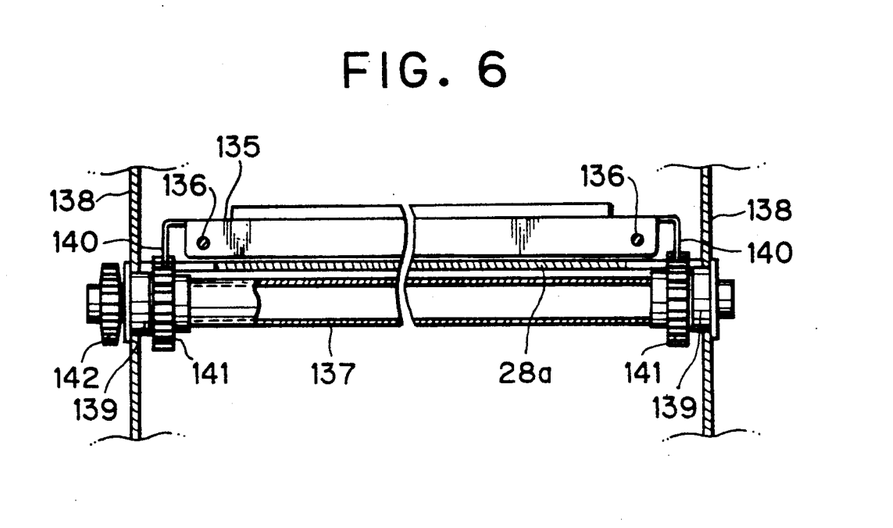
FIG. 6 is a cross-sectional front view showing the shutter mechanism according to the one embodiment.

In FIGS. 5 and 6, a shutter 135 is positioned immediately above the horizontal portion 28a of the partitioning wall 28 for selectively closing the opening 29 formed in the horizontal portion 28a. The shutter 135 has a plate shape having an area for sufficiently covering the opening 29. The shutter 135 has downwardly bent portions at which racks 140 are formed. A pair of support shafts 136 horizontally extend at a position immediately above the horizontal portion 28a for movably supporting the shutter 135 in the horizontal direction. Further, an operation shaft 137 horizontally extends in a direction perpendicular to the support shafts 136 at a position immediately below the horizontal portion 28a. Both axial end portions of the operation shaft 137 are rotatably supported to support walls 138 of the frame 1 through bearings 139. The both end portions of the operation shaft 137 integrally mount a pair of pinions 141 which the racks 140 of the shutter 135 are meshedly engageable. Further, a drive gear 142 is integrally mounted on one end of the operation shaft 137 and at a position outside the support wall 138. A reversible motor (not shown) is provided for rotating the gear 142.

Thus, in accordance with the rotation of the reversible motor, the gear 142 is rotated to thereby rotate the operation shaft 137 about its axis. Therefore, the pinions 141 are rotated to move the shutter 135 in the horizontal direction through the racks 140 so as to provide a closing position shown by two dotted chain line in FIG. 5 where the opening 29 of the horizontal portion 28a is closed by the shutter 135 during the reversal feed of the photosensitive sheet 5 and to provide a retract position shown by a solid line in FIG. 5 where the opening 29 is opened for performing an exposure operation.

In operation, the original is mounted on the original support glass 2 with an imaging surface facing downwardly, and the cover member 3 is positioned over the original. Upon manipulation of a start button (not shown), the original support glass 2 and the cover 3 are moved to one direction (rightwardly in FIG. 2), so that a left edge of the original is brought into confrontation with the halogen lamp 22, and thereafter, the halogen lamp 22 is turned on. The original support glass 2 is then moved to opposite direction (leftwardly in FIG. 2) during which the original is successively subjected to light exposure. At the same time, the photosensitive sheet 5 is moved toward the take-up shaft 20 at the speed equal to the moving speed of the original support glass 2. Therefore, the image carrying light is applied to the photosensitive sheet 5 through the opening 29, and a latent image corresponding to the original image is successively formed on the photosensitive surface 5a of the sheet 5 when it travels over the exposure stand 10. In this sheet travel, the take-up shaft 20 is rotated for winding the photosensitive sheet 5 thereover.

During the exposure operation, the feed roller 13 positioned between the exposure stand 10 and the pressure developing unit 15 has a solid line position shown in FIG. 1. That is, the pinch roller 12 is positioned to nip and feed the photosensitive sheet 5 in association with the drive roller 11 so as to positively feed the sheet 5 to the pressure developing unit 15 at a constant speed. Further, the dancer roller 14 has the solid line position (descent position) shown in FIG. 1 so as to absorb a slack of the photosensitive sheet 5.

On the other hand, each one of the developer sheet 31 is delivered from the sheet cassette 30 to the pressure developing unit 15 by the sector roller 30 in synchronism with the every leftward movement of the original support glass 2. The latent image portion of the photosensitive sheet 5 and the developer sheet 31 are pressed together by the pressure rollers 15a and 15b of the pressure developing unit 15, so that a colored visible image is formed on the developer sheet 31.

With the state, when the trailing end of the developer sheet 31 passes through the pressure developing roller 15a, the roller 15a is moved away from the other pressure roller 15b so as to release sheet pressurization. Thereafter, the microcapsule sheet 5 is separated from the developer sheet 31 at the separation roller 17, and the developer sheet 31 is introduced into the thermal fixing unit 34 so as to fix the color image on the sheet 31, and is then discharged onto the discharge tray 35. On the other hand, the photosensitive sheet 5 is wound over the takeup shaft 20. However, this take-up operation is stopped when the developer sheet 31 is separated from the photosensitive sheet 5 at the separation roller 17.

Here, when the exposure operation to the photosensitive sheet 5 is completed, the sheet nip releasing mechanism 37 is operated. That is, the drive motor (not shown) is energized to rotate the gear 48, so that the cam 47 is rotated in the clockwise direction in FIG. 3. Therefore, the lever 47 is pivotally moved about the shaft 46 in the clockwise direction in FIG. 3, so that the second link 40 is pivotally moved about the shaft 41 in the counterclockwise direction through the wire 43. Accordingly, the first link 38 is moved downwardly by a predetermined distance to move the pinch roller 12 to its descent position shown by two dotted chain line in FIG. 1. Consequently, the pinch roller 12 is moved away from the drive roller 11, so that the sheet nipping force can be released against the photosensitive sheet 5. As a result, at the time of reverse travel, the unexposed area or the photosensitive surface 5a of the photosensitive sheet can be protected against any damage due to the direct contact with these rollers.

At the same time, the cam 51 is rotated in the counterclockwise direction in FIG. 4 by the energization of the drive motor (not shown), so that the dancer roller shaft 14a is moved to its ascent position as shown by two dotted chain line in FIG. 1.

More specifically, when the developer sheet 31 is separated from the photosensitive sheet 5, a trailing edge of the light-exposed zone of the photosensitive sheet 5 is positioned at a position C (FIG. 2) where the trailing edge of the light exposed zone is positioned immediately downstream of the separation roller 17. In other words, a leading edge of the green zone or unexposed zone of the photosensitive sheet subsequent to the light exposed zone is also positioned to the position C exceeding the exposure stand 10. In order to use the green zone, the unexposed area must be moved back to the upstream portion of the exposure stand 10. That is, the leading edge of the unexposed zone should be positioned back to a position D in FIG. 2 for the next exposure operation. To attain the reversal feeding, the sheet cartridge shaft 7 is rotated about its axis in a direction indicated by an arrow B in FIG. 2. In this case, the reversal feed amount can be detected by the encoder 36 disposed in the feed roller 9. If the feed amount reaches a predetermined amount, that is, by a distance between positions C and D, the reversal takeup operation of the cartridge shaft 7 is stopped. Therefore, the leading edge line of the unexposed zone of the photosensitive sheet 5 can be positioned at immediately upstream side of the exposure stand 10. During the reversal feeding of the photosensitive sheet 5, the pinch roller 12 is moved to its descent position, whereas the dancer roller 14 is moved to its ascent position to avoid or reduce damage to the unexposed photosensitive surface 5a of the sheet 5 as described above.

Further, when the reversal rotation of the cartridge shaft 7 is started, the drive motor (not shown) is energized to rotate the operation shaft 37 about its axis. Therefore, the shutter 135 positioned at its retracted position is moved to the closing position shown by two dotted chain line in FIG. 5. Accordingly, the shutter 135 closes the opening 29 formed at the horizontal portion 28a of the partitioning wall 28. Consequently, the unexposed zone of the photosensitive sheet 5 can be protected against any light at the time of its reversal feeding. For example, even if an operator opens the cover 3 for replacing the original by a new original, the light entered into the interior of the apparatus through the original support glass 2 cannot reach the unexposed zone of the photosensitive sheet 5, since the opening 29 is closed by the shutter 135.

When the reversal feed of the photosensitive sheet 5 is completed, the pinch roller 12 and the dancer roller 14 are moved to their original positions for initiating the next exposure operation. At the same time, the shutter 135 is moved to its retracted position.

In the illustrated embodiment, the pinch roller 12 is provided movable toward and away from the drive roller 11 for selectively performing sheet nipping. However, both pinch roller 12 and the drive roller 11 can be provided movable toward and away from each other. Further, in the sheet nip releasing state, the photosensitive sheet 5 can be contacted to one of the drive roller 11 and the pinch roller 12. Alternatively, in the sheet nip releasing state, the sheet 5 can be out of contact with these rollers.

Further, in the illustrated embodiment, the shutter 135 is moved to its closing position for closing the opening 29 only when the photosensitive sheet 5 is reversely fed. However, if large time lag is provided from the end timing of the exposure to the start timing of the reversal sheet feeding, the shutter 135 can be positioned to its close position when the exposure is terminated. Furthermore, in the illustrated embodiment, the shutter 135 is positioned close to the exposure stand 10. However, the position of the shutter is not limited to this position, but various changes can be made so far as the shutter can block the leaked light against the unexposed zone of the photosensitive sheet 5.

As described above, according to the image recording apparatus of this invention, immediately after the exposure operation, the sheet nipping force given to the photosensitive sheet by the feed roller is released by the sheet nip releasing mechanism, and the unexposed zone positioned at downstream side of the exposure stand is fed back to the upstream side of the exposure stand. Therefore, the unexposed zone does not undergo any nipping pressure by the feed roller, and as a result, the photosensitive surface can be protected against any damage. Consequently, the unexposed zone can be utilized for the next exposure operation, and accordingly, the photosensitive sheet can be maximumly used without any waste portion.

Further, in the present invention, the optical path reaching the exposure zone is shut off by the shutter means during the reversal feeding of the photosensitive sheet. Therefore, the unexposed zone of the photosensitive sheet is not subjected to light irradiation during this reversal feed, to thereby use the unexposed zone for the next exposure operation, even if the cover member is opened during the reversal feed to allow the external light to pass through the original support glass and to direct the light toward the exposure zone.

While the invention has been described in detail and with reference to specific embodiment thereof, it would be apparent to those skilled in the art that various changes and modifications can be made therein without departing from the spirit and scope of the invention.

What is claimed is:

1. An image recording apparatus for forming a latent image on a rolled photosensitive sheet, the latent image corresponding to an image of an original, and for forming a visible image on a developer sheet, the visible image corresponding to the latent image, the apparatus comprising;

a cartridge shaft on which the rolled photosensitive sheet is provided;

an exposure portion on which the photosensitive sheet is positioned to form the latent image thereon, to thus provide an exposed zone, an unexposed zone being subsequent to the exposed zone;

a pressure developing unit positioned downstream of the exposure portion for superposing the exposed zone with the developer sheet and for pressing these sheet together for forming the visible image on the developer sheet;

a separation means positioned downstream of the pressure developing unit for separating the photosensitive sheet from the developer sheet;

a takeup means positioned downstream of the separation means for taking up the light exposed photosensitive sheet thereover, the photosensitive sheet being fed in one direction from the cartridge shaft to the takeup means;

feeding means positioned between the exposure portion and the pressure developing unit for nippingly feeding the photosensitive sheet toward the pressure developing unit at a constant speed in the one direction;

a sheet nip releasing mechanism connected to the feeding means for releasing the sheet nipping force of the feeding means when the unexposed zone of the photosensitive sheet is moved from the downstream portion of the exposure portion to the upstream portion thereof after the photosensitive sheet is separated from the developer sheet; and a reversal feed driving means for moving the photosensitive sheet in a second direction opposite the one direction.

2. The image recording apparatus as claimed in claim 1, wherein the reversal feed driving means comprises the cartridge shaft which is rotatable in the second direction for winding the photosensitive sheet thereover.

3. The image recording apparatus as claimed in claim 2, further comprising:
   a dancer roller positioned between the feeding means and the pressure developing unit and movable between a sheet slack absorbing position and a non operative position; and
   drive means for driving the dancer roller between the sheet slack absorbing position and the non operative position, the drive means driving the dancer roller to the sheet slack absorbing position during the exposure operation, and driving the dancer roller to the non operative position during the travel of the photosensitive sheet in the second direction.

4. The image recording apparatus as claimed in claim 2, wherein the feeding means comprises a drive roller and a pinch roller having a pinch roller shaft movable toward and away from the drive roller, the photosensitive sheet being nipped between the drive roller and the pinch roller for feeding the photosensitive sheet in the one direction.

5. The image recording apparatus as claimed in claim 4, wherein the sheet nip releasing mechanism comprises;
   a first link having one end rotatably supporting the pinch roller shaft and having another end;
   a biasing means connected to the pinch roller shaft for normally urging the pinch roller toward the drive roller;
   a pivotable second link having one end pivotally connected to the another end of the first link, and having another end;
   a wire member having one end connected to the another end of the second link, and having another end;
   a pivotable lever having one end connected to the another end of the wire member and having another end; and
   a rotatable cam member in contact with the another end of the pivotable lever for pivotally moving the lever, whereby the pinch roller 12 is selectively moved away from the drive roller 11 for releasing sheet nipping between the pinch roller and the drive roller.

6. The image recording apparatus as claimed in claim 2, further comprising;
   means for detecting a length of reversal feed amount of the photosensitive sheet, the detection means comprising an encoder provided in a roller positioned upstream of the exposure portion.

7. The image recording apparatus as claimed in claim 2, wherein an optical path is defined reaching the exposure portion, and the image recording apparatus further comprises a shutter mechanism comprising a shutter provided movable to a retract position for allowing a light to direct to the exposure portion and a closing position for blocking the light on the optical path, and means for driving the shutter to the retract position during the exposure operation and to the closing position during the reversal feed of the photosensitive sheet, whereby the light irradiation to the unexposed zone is avoidable during the reversal feed.

8. An image recording apparatus for forming a latent image on a rolled photosensitive sheet, the latent image corresponding to an image of an original, and for forming a visible image on a developer sheet, the visible image corresponding to the latent image, the apparatus comprising;
   a cartridge shaft on which the rolled photosensitive sheet is provided;
   an exposure portion on which the photosensitive sheet is positioned to form the latent image thereon, to thus provide an exposed zone, an unexposed zone being subsequent to the exposed zone, an optical path being directed to the exposure portion;
   a pressure developing unit positioned downstream of the exposure portion for superposing the exposed zone with the developer sheet and for pressing these sheet together for forming the visible image on the developer sheet;
   a separation means positioned downstream of the pressure developing unit for separating the photosensitive sheet from the developer sheet;
   a takeup means positioned downstream of the separation means for taking up the light exposed photosensitive sheet thereover, the photosensitive sheet being fed in one direction from the cartridge shaft to the takeup means;
   a reversal feed driving means for moving the photosensitive sheet in a second direction opposite the one direction in order to move the unexposed zone positioned downstream of the exposure portion to the upstream side thereof, and
   a shutter mechanism having a shutter movable between a retract position for allowing a light to direct to the exposure portion and a closing position for blocking the light on the optical path, and means for driving the shutter to the retract position during the exposure operation and to the closing position during the reversal feed of the photosensitive sheet, whereby the light irradiation to the unexposed zone is avoidable during the reversal feed.

* * * * *